United States Patent [19]

Riddle

[11] 4,010,318
[45] Mar. 1, 1977

[54] PROBE FORMING ELECTRON OPTICAL COLUMN HAVING MEANS FOR EXAMINING MAGNIFIED IMAGE OF THE PROBE SOURCE

[75] Inventor: George Herbert Needham Riddle, Princeton, N.J.

[73] Assignee: RCA Corporation, New York, N.Y.

[22] Filed: Sept. 15, 1975

[21] Appl. No.: 613,535

[30] Foreign Application Priority Data

May 20, 1975 United Kingdom ............ 21550/75

[52] U.S. Cl. .................. 358/178; 179/100.1 B; 346/161; 346/151; 358/129
[51] Int. Cl.² ............ H04N 5/76; G11B 9/00
[58] Field of Search ....... 178/6.6 R, 6.6 A, 6.6 DD, 178/6.6 P, 6.6 TP, 6.7 R, 6.7 A; 340/173 CR, 173 TP; 346/74 TP, 74 R, 74 ES, 74 EB, 74 J, 74 CR, 110 R; 179/100.1 B

[56] References Cited

UNITED STATES PATENTS

| | | | |
|---|---|---|---|
| 3,120,991 | 2/1964 | Newberry et al. | 178/6.6 TP |
| 3,534,166 | 10/1970 | Korpe | 178/6.7 R |
| 3,638,231 | 1/1972 | Le Poole et al. | 178/6.7 R |

Primary Examiner—Raymond F. Cardillo, Jr.
Attorney, Agent, or Firm—Eugene M. Whitacre; William H. Meagher; Dilip A. Kulkarni

[57] ABSTRACT

An electron optical column apparatus, including a source of electrons, is operable in either a setup or a probe mode. In the setup mode, the electron source is magnified in an image plane for examination of the source by a Faraday cup prior to operation of the column in the probe mode. In the probe mode, the electron source is demagnified on an object surface, for example, for recording video signals on a record medium.

10 Claims, 3 Drawing Figures

PROBE FORMING ELECTRON OPTICAL COLUMN HAVING MEANS FOR EXAMINING MAGNIFIED IMAGE OF THE PROBE SOURCE

This invention relates to electron optical columns, and more particularly, to electron optical columns which are operable in a probe mode for providing a demagnified image and in a setup mode for providing a magnified image permitting examination of the electron source for adjustment purposes prior to operation of the column in the probe mode.

Although the invention will be described herein in the context of an electron beam apparatus for recording video signals, it has applications in other areas where the size, shape, and quality of the electron probe is of particular importance: for example, electron lithography.

In video recording, an electron beam is intermittently blanked in order to selectively expose a coating of electron beam sensitive material on a storage medium along a spiral track in accordance with signals to be stored. The coating of electron beam sensitive material is then developed and the exposed areas are removed leaving a series of depressed areas along the track representative of the signals stored.

For real time recording of the video type signals, it is desirable to use a source providing an electron beam having an elongated cross-section at the source: for example, the length — 800 micrometers, and the width — 20 micrometers. In the probe mode (recording mode), a first set of lenses demagnifies the source on the surface of the storage medium. The cross-section of the electron beam at the surface of the storage medium is extremely small: for example, the length — 4 micrometers, and the width — 0.1 micrometer. In order to properly record video signals on the storage medium, it is desirable that the demagnified image of the source on the storage medium have appropriate size, shape, and current density. Moreover, the distribution of the current density should desirably be fairly uniform and symmetric in the demagnified image. Due to the extremely small size of the demagnified image, it is difficult to verify the size, shape, current density, and current distribution near the surface of the storage medium. However, since the magnifying properties of the first set of lenses can be known and may be adjusted, it is sufficient to verify the size, shape, current density, and current distribution of the source.

For such source verification, one may, for example, mount the source on a separate electron optical bench which would magnify the image and display it in a manner suitable for examination. The above-said technique gives excellent data on the source, but requires removal of the source from the column for examination. Such a procedure is undesirable since it provides no assurance that the source characteristics are not disturbed during the transfer. Moreover, the technique requires a substantial investment in a separate electron optical bench and represents a sizable inconvenience in the transfer procedure.

Alternately, one may scan the demagnified image across very small particles (e.g., 0.3 micrometers) of shiny platinum against a dark graphite background. This technique permits only a rough examination of the source because of relatively large size of the platinum particles (e.g., 0.3 micrometers) with respect to the size of the demagnified image (e.g., width —0.1 micrometers, and length —4.0 micrometers). The present invention overcomes the above-discussed problems.

In accordance with the principles of the present invention, an electron optical column apparatus, including a source of an electron beam, is provided for operation in either a setup or a probe mode. In the setup mode, the electron source is magnified in an image plane for examination. Means, including sampling means selectively subject to location in the image plane in the path of the electron beam and subject to removal from the path, is provided for determining the current density of the portion of the magnified image which is intercepted by the sampling means when the sampling means is located in the image plane in the path of the electron beam while the column apparatus is in the setup mode. Means are provided for selectively positioning the magnified image in the image plane relative to the sampling means to selectively determine the current density of the portion of the magnified image which is intercepted by the sampling means while the column apparatus is in the setup mode. In the probe mode, the electron source is demagnified on an object surface to be probed.

In the accompanying drawings in which like reference characters refer to similar parts:

Figure 1:
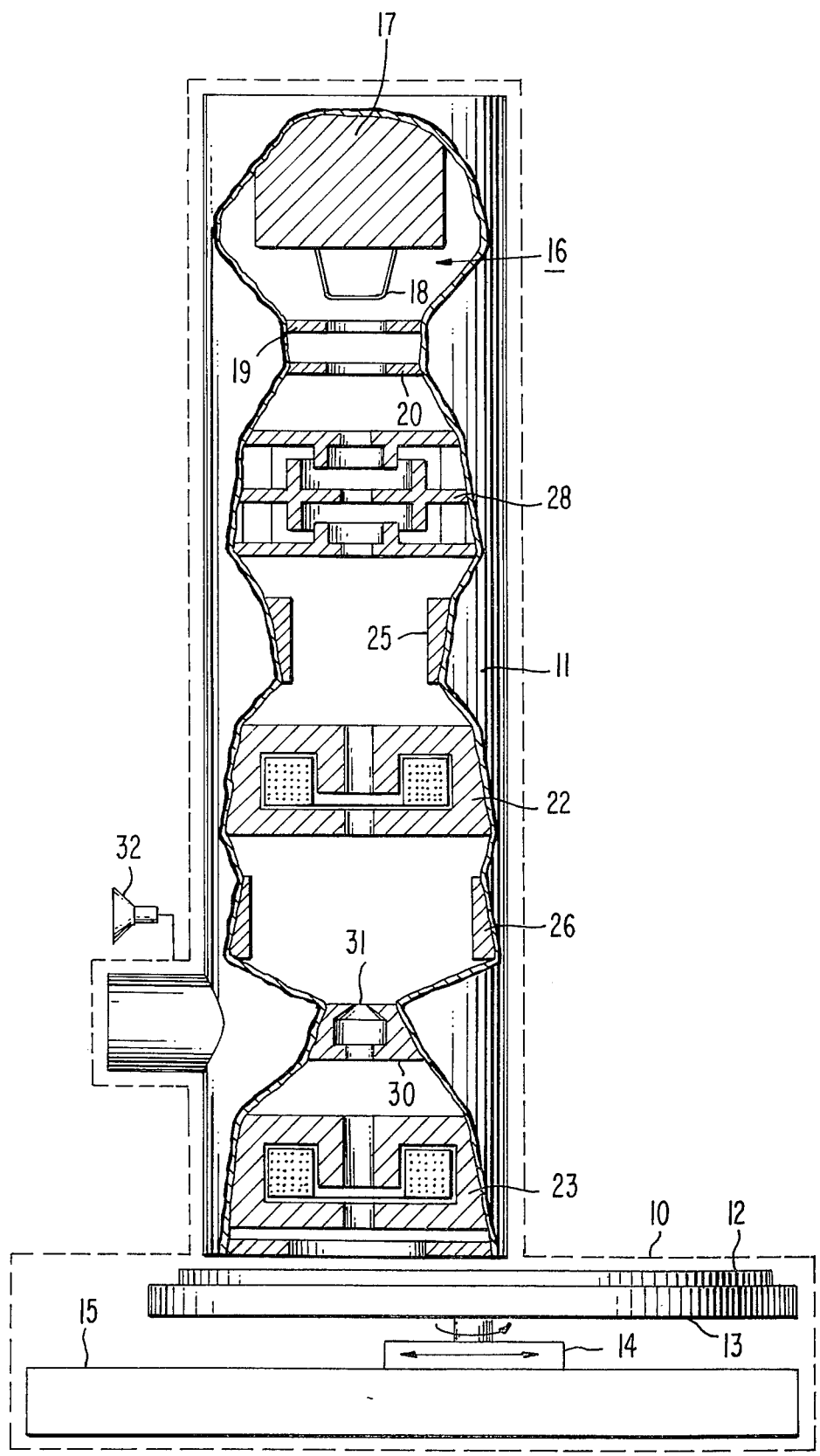
FIG. 1 is a schematic representation of an electron beam disc recorder including a dual mode electron optical column pursuant to the principles of the present invention.

Referring now to the drawings, reference numeral 10 denotes an electron beam disc recorder including a dual mode electron optical column 11. A master 12 is placed underneath the electron optical column 11 on a rotatable turntable 13. Means (not shown) are provided for rotating the turntable 13. The turntable 13 is mounted on a carriage 14 for radial movement. The electron optical column 11 and the chamber provided for housing the turntable 13 are evacuated by a vacuum system (not shown) during operation of the electron beam disc recorder 10.

Figure 2:
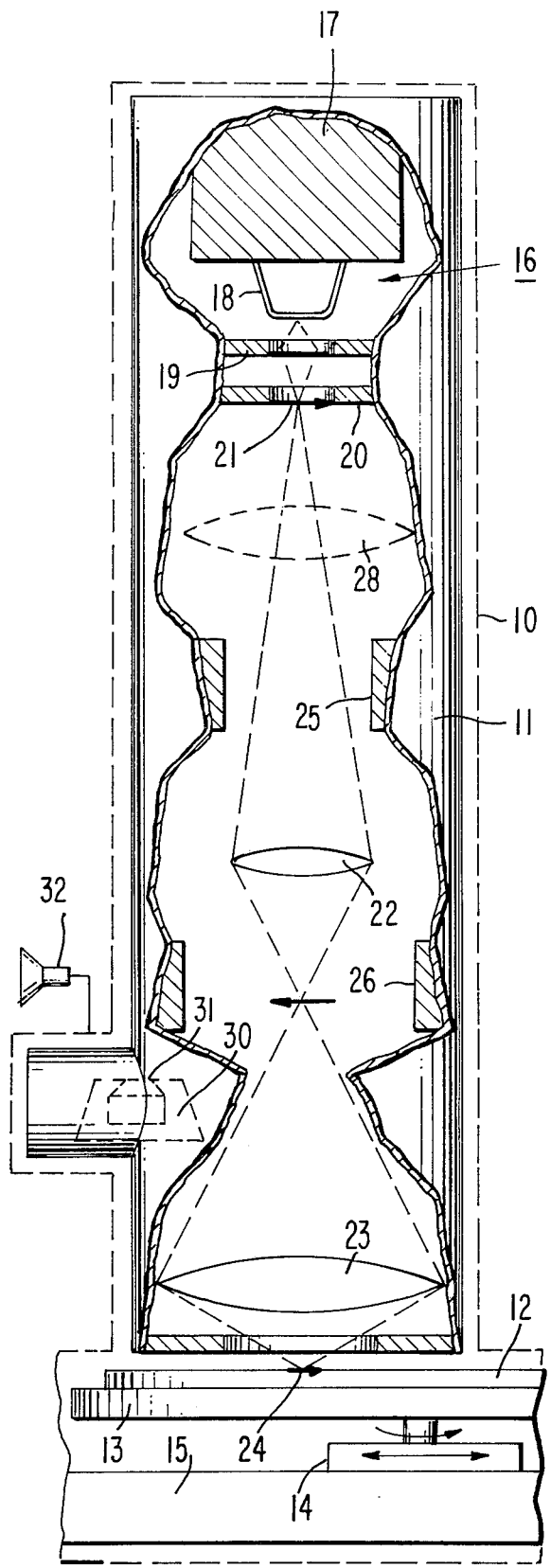
FIG. 2 is a ray diagram illustrating the operation of the dual mode electron optical column of FIG. 1 in a probe mode.
Figure 3:
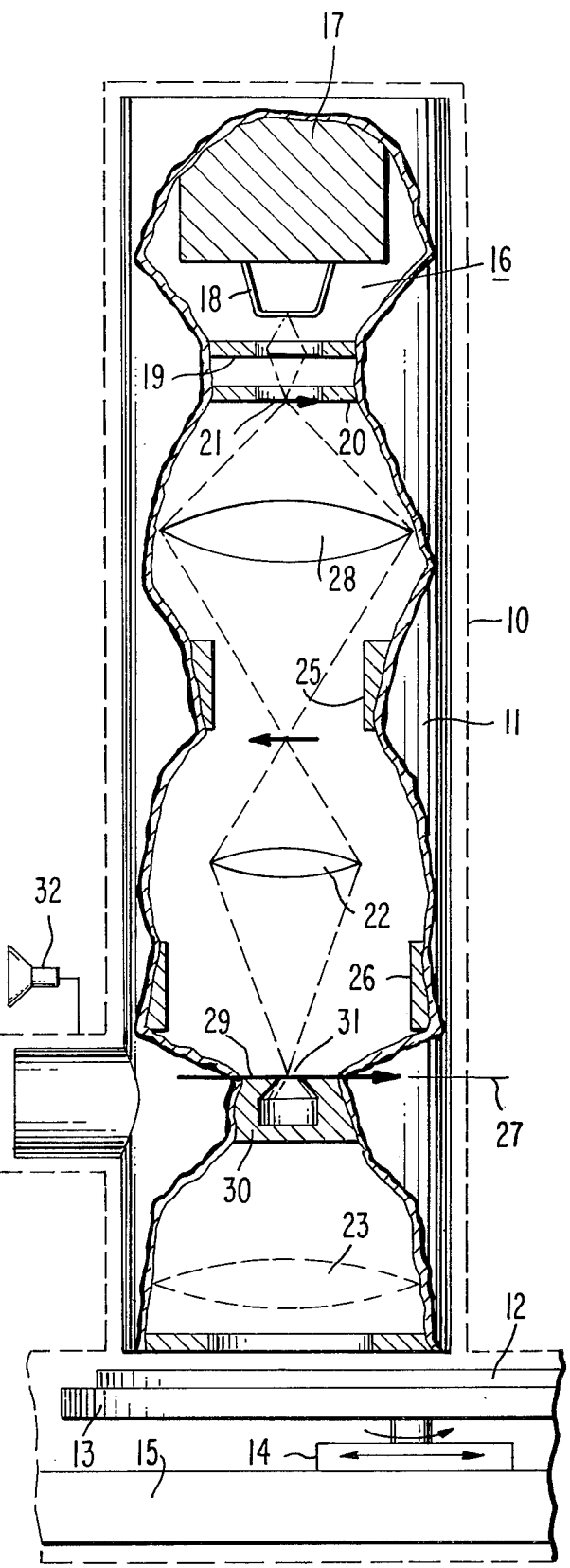
FIG. 3 is a ray diagram illustrating the operation of the dual mode electron optical column of FIG. 1 in a setup mode.

The dual mode electron optical column 11 includes a source (or an electron gun) 16 mounted on a source adjusting means 17 for providing a beam of electrons along a path toward the surface of the master 12. The source 16, in this particular embodiment, comprises a heated filament 18 providing a beam of electrons along the optical axis of the column, a grid 19 having an aperture for shaping and modulating the electron beam, and an anode 20 for further shaping and accelerating the modulated electron beam. The above-mentioned grid 19 and anode 20, together with the filament 18, comprise an electron gun which forms the source image 21. The source image 21, as shown in FIGS. 2 and 3, has a cross-section of the order of 800 × 20 micrometers. While the emission source, in this particular embodiment, is indicated as a directly heated filament, it could very well be an indirectly heated rod (e.g., lanthanum hexaboride), or another type of source, such as a field emitter. It is noted that the source may include additional components, such as a lens to form an additional image, an aperture to further define the additional image, etc.

In the probe mode, as illustrated in FIG. 2, the source image 21 is demagnified and focused on the surface of the master 12 by a second lens 22 and a third lens 23. The demagnified image 24 of the source at the surface of the master has a cross-section of the order of 4 × 0.1 micrometers. The total demagnification provided by the two lenses 22 and 23, is about 1/200. In this particular embodiment, the respective focal lengths of the second and the third lenses 22 and 23, are approximately 2.6 and 0.58 centimeters, and the respective demagnifying powers of the second and the third lenses are approximately 0.15 and 0.33.

In order to reduce aberrations in the demagnified image 24, in this particular embodiment, the lens 23 is electromagnetic. Moreover, since aberrations in the demagnified image are primarily proportional to the focal length of the final demagnifying lens, the focal length of the lens 23 is made relatively small: for example, 0.58 centimeters.

The dual mode electron optical column 11 further includes deflection plates 25 and the blanking plates 26. While, in this particular embodiment, deflection plates 25 and blanking plates 26 are used, it is possible to substituted deflection coils and blanking coils therefor.

In operation of the video disc recorder 10, the master 12, coated with a thin layer of electron sensitive material, is placed on the turntable 13 for rotation therewith. The source image 21 is demagnified and focused on the surface of the master 12. The electron source is intermittently blanked out by the blanking plates 26 in accordance with signals to be recorded in order to selectively expose the electron sensitive material. The blanking is achieved, for example, by diverting the electron beam away from the optical axis of the electron optical column 11. The turntable 13 carrying the master 12 is moved radially by the carriage for recording the signals along a spiral track on the surface of the master. After development of the recorded master 12, the exposed areas are removed leaving a series of depressed areas along the track representative of the signals stored.

In the setup mode, as illustrated in FIG. 3, the source 21 is magnified and focused in an image plane 27 by a first lens 28 and the second lens 22. The magnified image 29 of the source in the image plane 27 has a cross-section of the order of 24,000 × 600 micrometers. The total magnification provided by the two lenses, 28 and 22, is about 30. In this particular embodiment, the respective focal lengths of the first and the second lenses, 28 and 22, are approximately 2.5 and 2.6 centimeters, and the respective magnifying powers of the first and the second lenses are approximately 5 and 6. It is noted that the focal length of the second lens 22, being operative in both the setup mode and the probe mode, is the same in both modes. It is further noted that the first lens 28 is inoperative in the probe mode (FIG. 2), while the third lens 23 is inoperative in the setup mode (FIG. 3). However, because in this particular embodiment the image plane 27 is located above the third lens 23, it is not necessary to de-excite the third lens 23 in the setup mode. While, in this particular embodiment, the first lens 28 is shown electrostatic in the drawings it could very well be electromagnetic.

A Faraday cup 30, having an entrance window 31, is provided for determining the current density of the source when the entrance window 31 is located in the image plane 27 in the path of the electron beam for intercepting a portion of the magnified image 29 while the column 11 is in the setup mode. The deflector plates 25 selectively position the magnified image 29 in the image plane 27 relative to the entrance window 31 to selectively determine the current density of the portion of magnified image which is intercepted by the entrance window while the column 11 is in the setup mode. The output of the Faraday cup 30 is fed to an external cathode ray display tube 32 for examination of the source. In the probe mode, the Faraday cup 30 is removed from the path of the electron beam.

The source image 21 may be represented on the cathode ray display tube 32 in a number of different ways. For example, the brightness of the image developed on the tube 32 may be derived from the output of the Faraday cup 30 for displaying a direct raster-type image. Alternately, the vertical deflection of the luminescent spot on the screen of the tube 32 may be derived from the output of the Faraday cup 30, while the horizontal deflection of the luminescent spot on the screen is correlated to the position of the magnified image 29 with respect to the entrance window 31 for displaying a beam profile image. Additionally, it is possible to simply measure the current output of the Faraday cup 30 without displaying it on the tube 32.

Since the magnified image 29 has a cross-section of the order of 24,000 × 600 micrometers, an excellent resolution is obtained with an entrance window 31 having a diameter of the order of 50 micrometers. An aperture of the order of 300 micrometers is inserted in the second lens 22 in order to limit the angular spread of the electron beam into the Faraday cup 30. Since the aperture in the second lens 22 is sufficiently large, it does not interfere with the electron beam in the probe mode. The reason for making the second lens 22 electromagnetic is that an aperture is required therein.

It is noted that, since the angular spread of the electron beam at the Faraday cup 30 and the area of the magnified image 29 being sampled are known, it is also possible to make a quantitative measurement of the brightness of the sampled portion of the image 29.

The source adjusting means 17 is used to permit modification of the source characteristics while the column 11 is in the setup mode. The source adjusting means 17 may be of the advantageous form disclosed in a copending application of G. H. N. Riddle, et al., Ser. No. 613,534 entitled "MECHANICALLY ADJUSTABLE ELECTRON GUN APPARATUS," and filed on even date with the subject application.

Thus, a dual mode electron optical column is provided which is operable in a probe mode for providing a demagnified image of the electron source, and which is additionally operable in a setup mode for providing a magnified image of the electron source permitting examination of the source for adjustment purposes prior to the operation of the column in the probe mode. This column is particularly useful in electron beam disc recording where very specific line image shapes are requied for producing successful recordings.

What is claimed is:
1. A dual mode electron optical column apparatus operable in either a probe or a setup mode comprising:
 1. a source of providing a beam of electrons along a path toward an object surface to be probed;
 2. means for providing a demagnified image of the source on the object surface when the electron optical column apparatus is in the probe mode;

3. means for providing a magnified image of the source in an image plane when the electron optical column apparatus is in the setup mode;

4. means, including sampling means selectively subject to location in the image plane in the path of the electron beam and subject to removal from the path, for determining the current density of the portion of the magnified image which is intercepted by the sampling means when the sampling means is located in the image plane in the path of the electron beam while the electron optical column apparatus is in the setup mode; and 5. means for varying the position of the magnified image of the source in the image plane relative to the sampling means while the sampling means is located in the path of the electron beam to permit determination of the current distribution of the magnified image by the current density determining means as various portions of the magnified image are, a seriatim, intercepted by the sampling means.

2. A dual mode electron optical apparatus as defined in claim 1 further including:

1. a platform for movably carrying a storage medium having a layer of electron beam sensitive material; and 2. means for intermittently blanking the electron beam in accordance with the signal to be recorded on the storage medium for selectively exposing the electron beam sensitive layer when the column apparatus is in the probe mode.

3. A dual mode electron optical column apparatus as defined in claim 2 wherein the platform rotatably carries the storage medium, and wherein the apparatus further includes means for moving the platform relative to the electron beam radially of the storage medium in order to record along a spiral track on the storage medium when the column apparatus is in the probe mode.

4. A dual mode electron optical column apparatus as defined in claim 1 wherein the means for providing a magnified image of the electron source when the column is in the setup mode comprises a first lens and a second lens; wherein the means for providing a demagnified image of the electron source when the column is in the probe mode comprises the second lens and a third lens; wherein the first lens is inoperative when the column is in the probe mode; and wherein the third lens is inoperative when the column apparatus is in the setup mode.

5. A dual mode electron optical column apparatus as defined in claim 4 wherein the focal length of the second lens, being operative in both the setup mode and the probe mode, is the same in both modes.

6. A dual mode electron optical column apparatus as defined in claim 1 further including means for adjusting the source to permit modification of the source characteristics.

7. A dual mode electron optical column apparatus as defined in claim 6, wherein the sampling means comprises a Faraday cup having an entrance window for sampling a portion of the magnified image of the source.

8. A dual mode electron optical column apparatus as defined in claim 7 wherein the position varying means sweeps the magnified image of the source across the entrance window in a television raster manner while the electron optical column apparatus is in the setup mode.

9. A dual mode electron optical column apparatus as defined in claim 8 wherein the current density determining means further includes a cathode ray display tube, and wherein the brightness of an image displayed on he cathode ray tube is derived from the output of the Faraday cup for visual display of the shape and quality of the source while the electron optical column apparatus is in the setup mode.

10. A dual mode electron optical column apparatus as defined in claim 8 wherein the current density determining means further includes a cathode ray display tube, wherein the vertical deflection of the luminescent spot on the screen of the cathode ray display tube is derived from the output of the Faraday cup, and wherein the horizontal deflection of the luminescent spot on the screen of the cathode ray display tube is correlated to the position of the magnified image with respect to the sampling window of the Faraday cup while the electron optical column apparatus is in the setup mode.

* * * * *